United States Patent [19]

Pernick

[11] Patent Number: 4,471,445

[45] Date of Patent: Sep. 11, 1984

[54] FOURIER TRANSFORM SIGNAL PROCESSOR

[75] Inventor: Benjamin J. Pernick, Hampton Bays, N.Y.

[73] Assignee: Grumman Aerospace Corporation, Bethpage, N.Y.

[21] Appl. No.: 249,188

[22] Filed: Mar. 30, 1981

[51] Int. Cl.[3] .......................... G06G 9/00; G06G 7/19; G01R 23/18

[52] U.S. Cl. .................................... 364/485; 364/481; 364/827; 350/162.12

[58] Field of Search ............... 364/525, 485, 822, 576, 364/827, 481; 350/3.66, 3.82, 162.12, 162.13, 162.14

[56] References Cited

U.S. PATENT DOCUMENTS

| | | | |
|---|---|---|---|
| 3,591,252 | 7/1971 | Sun Lu | 350/162.12 |
| 3,623,024 | 11/1971 | Hamilton | 350/162.12 |
| 3,697,149 | 10/1972 | Van Heekeren | 350/162.12 |
| 3,786,180 | 1/1974 | Macovski | 350/3.66 |
| 3,872,293 | 3/1975 | Green | 364/822 |
| 4,033,665 | 7/1977 | Firester | 350/3.82 |
| 4,073,010 | 2/1978 | Casasent et al. | 364/822 |
| 4,164,788 | 8/1979 | Jain | 364/525 X |
| 4,275,454 | 6/1981 | Klooster, Jr. | 364/822 |

FOREIGN PATENT DOCUMENTS

| | | | |
|---|---|---|---|
| 1233007 | 5/1971 | United Kingdom | 350/162.12 |

OTHER PUBLICATIONS

Frantz et al.: Optical Phase Measurement in Real Time Applied Optics, vol. 18, No. 19, Oct. 1, 1979, pp. 3301-3306.

McDermott: Holographic Displays in Real Time Move from Dream to Development, Electronic Design, Jul. 15, 1971, p. 28.

Arm et al.: Holographic Storage of Electrical Signals, Applied Optics, vol. 8, No. 7, Jul. 1969, pp. 1413-1419.

*Primary Examiner*—Felix D. Gruber

*Attorney, Agent, or Firm*—Morgan, Finnegan, Pine, Foley & Lee

[57] ABSTRACT

A hybrid opto-electronic method and apparatus for Fourier transform measurements of temporal signals are disclosed.

The magnitude and phase of the signal transform are system outputs. High resolution spectral analysis operation is accomplished by proper spatial phase corrections, equivalent to aperture synthesis. Configurations for one-dimensional and two-dimensional input data formats are described. The disclosed method and apparatus can process signals with continuous spectral content as well as narrow spectral lines.

8 Claims, 5 Drawing Figures

FOURIER TRANSFORM SIGNAL PROCESSOR

BACKGROUND OF THE INVENTION

This invention relates to a method and apparatus for measuring the Fourier transform of a spatially recorded pattern derived from a time varying signal or waveform. More specifically, it relates to the application of certain phenomena and relationships of optics to generate the Fourier transform spectrum for an input transmittance record and the application of certain phenomena and relationships of electronics to generate the magnitude and phase components of the transform spectrum.

Signal processing with very high spectral resolution, or equivalently large time bandwidth product, coupled with a multichannel format is of value in several important areas. For example, in radar applications, improved signal frequency resolution for FM or Doppler radars results in an enhanced range resolution capability since range resolution is determined by signal frequency resolution. Better frequency resolution also aids discrimination of multiple targets whose Doppler frequencies are relatively close, corresponding to small differences in target speeds. Sensitive Doppler frequency discrimination is also needed to increase the target to clutter ratio in a moving target indicator radar (MTI). Large time bandwidth systems are also useful in wideband RF signal processing, EM spectrum surveillance, acoustic signal processing, speech analysis applications, and signal correlators.

Fourier spectrum analysis of time varying signals by means of light diffraction is an inherent property of coherent optical processors responsible for continued interest in optical analog methods. Several types of processing systems have evolved for applications dealing with signal power spectrum analysis and correlation.

The so-called space integrating technique involves processing a temporal signal recorded as a transmittance pattern in a two- dimensional raster format. This type of processor offers extremely high resolution (or time bandwidth product) analysis of isolated, pure tone frequencies. With appropriate precautions, the power spectral density of signals with continuous spectra can also be obtained.

A second class, called time integrating processors, requires no spatial signal storage prior to processing. Instead, one relies upon temporal integration of intensity modulated beams with an output detector.

Several acoustooptic systems have been proposed to take advantage of some desirable features from each of the above mentioned methods. Both techniques require the use of several acoustooptic modulators for temporal signal modulation and for chirp waveform phase modulation as well. Two dimensional interrogation of an output plane would still be used for coarse and fine frequency display of an isolated, pure tone input signal. The output scanning format needed for high resolution performance is still complicated for signals with continuous spectra.

There are several major limitations to these presently used techniques. In these conventional optical Fourier processors, the length or time duration of the signal to be Fourier analyzed is set by the size of the aperture or the time constant of the detection and associated circuitry. Signals that extend beyond the aperture or are longer in time than the time constant factors cannot be processed coherently; that is, the resolution of the spectrum is established by these limiting system constraints. Also, the output of these systems deals with a light intensity pattern that is proportional to the power spectral density (PSD) of the signal to be analyzed and not its Fourier transform.

A two dimensional system can achieve high resolution analysis with restrictions. However, the ability to process simultaneously more than one signal is lost with such systems. Two dimensional Fourier processors can only yield high resolution spectral analysis when the output light pattern is scanned or interrogated in a very special manner. To achieve high resolution, one must scan the output distribution in a complicated, raster-like fashion. In addition, the output is proportional to the signal PSD and not its Fourier transform components. Also, certain time-integrating optical processors need more than one acoustooptic modulator.

An optimal Fourier transform signal processor would have several important attributes. In particular, it should be capable of providing high spectral resolution. Moreover, it should be capable of multichannel operation. Also, it should not be limited to signal PSD measurements alone. Instead, it should be capable of providing the more fundamental signal Fourier transform magnitude and phase components, (with which one can then perform correlation, convolution, frequency band analysis as well as PSD operations). It should not be limited to signals with narrow band frequency content, but should be able to process signals with continuous spectral features as well.

It is accordingly a general object of the present invention to overcome the aforementioned limitations and drawbacks associated with the known processors and to fulfill the needs mentioned by providing a method and apparatus for Fourier Transform measurements of temporal signals having characteristics more nearly approaching the optimal attributes noted above.

It is a specific object of the present invention to provide a method and apparatus for measuring the Fourier transform of a spatially recorded pattern derived from a time varying signal or waveform with very high resolution.

Other objects will be apparent in the following detailed description and practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as a method and apparatus for making Fourier transform magnitude and phase measurements of an input signal recorded as a spatial transmittance pattern, the method comprising the steps of: optically forming the Fourier transform spectrum of the recorded input signal; superposing and optical reference beam with said optical Fourier transform spectrum; and electronically processing the intensity distribution of the combined reference beam and optical Fourier transform spectrum to obtain the magnitude and phase components of the input signal; and the apparatus comprising: means for optically forming the Fourier transform spectrum of the recorded input signal; means for superposing an optical reference beam with said optical Fourier transform spectrum; and means for electronically processing the intensity distribution of the combined reference beam and optical Fourier transform spectrum to obtain the magnitude and phase components of the input signal.

BRIEF DESCRIPTION OF THE DRAWINGS

Serving to illustrate the exemplary embodiment of the invention are the drawings of which.

DETAILED DESCRIPTION OF THE PREFERRED EMBODIMENT

In accordance with the present invention, opto-electronic techniques are used to generate both magnitude and phase of a Fourier transform spectrum for an input transmittance record. The Fourier transformation is achieved by optical means whereas summing and storage operations are performed electronically.

The processing method disclosed here deals with a temporal signal recorded as a spatial transmittance pattern over a finite input aperature length, (corresponding to the signal integration time). In effect, the signal is Fourier processed in a "snapshot" mode rather than as a continuous time function, as occurs in the above mentioned time integrating systems.

As discussed in more detail below, the Fourier transform is generated by illuminating the input record with coherent light and gathering the diffracted rays with a transform lens. The transform light distribution is superposed and added interferometrically to an optical plane wave whose optical frequency is intentionally offset or shifted by a controlled amount from the optical frequency of the transform light distribution. The signal of interest is obtained from the time varying intensity component of the superposed beams in the output of a detector. The system of the present invention uses a temporal carrier signal at the offset frequency. Carrier amplitude is proportional to the (spatially dependent) Fourier transform magnitude and carrier phase is simply related to the signal (spatial) phase. Summation and storage of derived amplitude and phase signal outputs are performed electronically. As a result, frequency content of the transform magnitude and phase quantities can be measured with very high resolution by preserving signal processing continuity during sequential processing.

The system output, magnitude and phase of the transform, can be used to form the signal power spectrum, correlations, etc., thereby replicating features of any of the above mentioned systems. Most important, performance of this hybrid technique is not restricted to pure tone signals for accuracy. Quantitative measurements of the transform magnitude and phase for wideband, continuous signals can be obtained as a function of frequency with high resolution. Multichannel operation is also possible; its implementation depends upon recording, detection and processing speed limitations.

Figure 1:
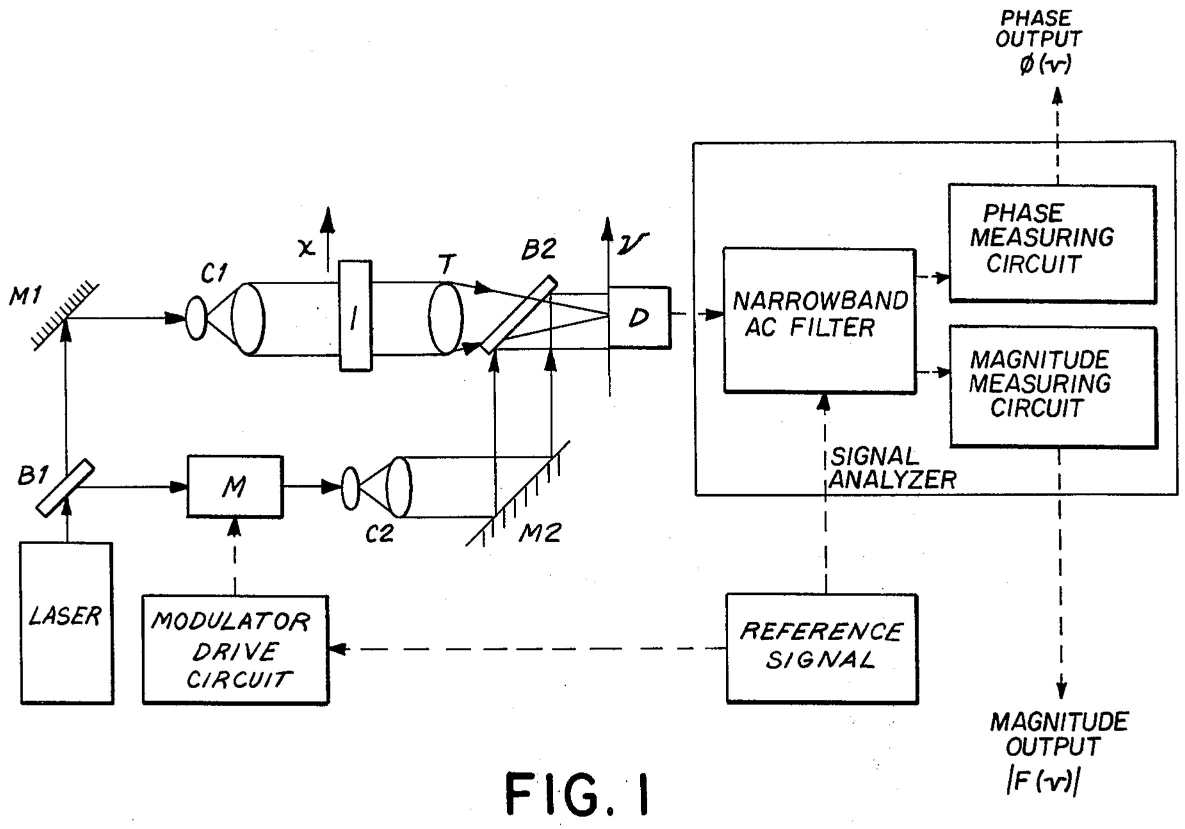
FIG. 1 is a schematic of the basic single channel system for Fourier transform magnitude and phase measurements.

A schematic of the basic single channel system for Fourier transform measurements is illustrated in FIG. 1. As shown therein, light from a source of coherent light, such as a laser, is divided by means of a beamsplitter B1. The transmitted beam is used in a conventional optical (spatial) Fourier transform arrangement. After reflection from mirror M1, the beam is expanded, spatially filtered and collimated with the lens subsystem C1. The input signal, recorded as a one-dimensional transmittance pattern in the input plane of recording device I, is illuminated with the plane wave beam from lens subsystem C1. Light diffracted by the signal transmittance record is focussed by a transform lens T onto a detector or detector array D in an output plane.

For purposes of the following analysis, f(x) represents the recorded spatial signal to be analyzed. The x-coordinate is located in the plane of FIG. 1 as illustrated. The light amplitude distribution (also in the plane of the figure) at the detector array location is proportional to the spatial Fourier transform of the signal f(x) and is given by (neglecting multiplicative constants):

$$F(\nu) = \int_{0}^{L} f(x)\exp(-j2\pi\nu x)dx \qquad \nu = x_D/\lambda F_T \tag{1}$$

where L is the length of the recorded signal in the input plane I, $\nu$ the spatial frequency variable, $F_T$ the focal length of the transform lens, $\lambda$ the laser wavelenth, and $x_D$ the position in the detector plane.

It is convenient for the following analysis to express the complex quantity $F(\nu)$ in phasor form as:

$$F(\nu) = |F(\nu)|\exp(j\phi(\nu)) \tag{2}$$

where $\phi(\nu)$ is a spatially dependent phase function.

Consider now the portion of the laser beam reflected by the beamsplitter B1. It serves as a temporal reference beam in subsequent combination with the Fourier transformed signal beam. The reference beam is frequency shifted by means of a modulator M, driven by means of a drive circuit in synchronization with a reference signal waveform. For example, an electrooptic crystal is used to induce a linear, time dependent refractive index change $\eta = n_o + (dn/dt)t$ in the crystal under voltage control. This index change is encoded onto the transmitted laser beam as a temporal, linear phase modulation.

After expansion, spatial filtering and collimation by the lens subsystem C2, the temporal reference beam is superposed onto the focussed diffraction pattern distribution in the detector array plane by means of the mirror M2 and beamsplitter B2. Assume a plane wave geometry at normal incidence to the detector plane for this beam. The light amplitude of the plane wave is A $\exp(j(\omega_M t + \delta))$, where A denotes the magnitude, $\omega_M/2\pi$ the temporal modulation frequency and $\delta$ is an arbitrary constant phase angle. The modulation frequency is proportional to the refractive index change dn/dt in the above example. If is noted that the modulation element can be incorporated equally well into the optical transform path, before the collimation stage C1. Such a configuration is advantageous for multichannel recording on a common input device when several temporal modulation frequencies are needed.

The total optical field amplitude at a point in the detector plane is given by the sum:

$$R(\nu,t)=R=|F(\nu)|\exp(j\phi(\nu))+A\exp(j(\omega_M t+\delta)) \quad (3)$$

since both beams are assumed coherent throughout the region of overlap. The corresponding light intensity distribution is:

$$RR^*=|F(\nu)|^2+A^2+2A|F(\nu)|\cos(\omega_M t-\phi(\nu)) \quad (4)$$

where, for convenience, the phase angle $\delta$ has been set equal to zero. Assume the detector aperture is reasonably small such that the detector output is proportional to the light level RR* of Eq. (4). The first two terms are time independent and are suppressed by a narrow band ac filter in the conventional electronic network, or signal analyzer that processes the detector signal. The magnitude $|F(\nu)|$ and spatial phase $\phi(\nu)$ are required outputs of the conventional electronic network. Methods and circuits to measure magnitude and phase of a sinusoidal signal, which are well known and can be found in electronic reference books, are located in the signal analyzer.

Before applying the principles illustrated in FIG. 1 to a high resolution processor for a one-dimensional signal record, it may be helpful to first consider the steps necessary to find the Fourier transform for a sum of N input functions:

$$v(x)=f_1(x)+f_2(x)+\ldots+f_N(x) \quad (5)$$

Assume that the individual signals $f_i(x)$ are processed in sequence i.e., first deal with the signal $f_1(x)$ then $F_2(x)$, etc. The magnitude $|F_i(\nu)|$ and phase $\phi_i(\nu)$ are determined with the system of FIG. 1 and stored at each step. After processing all N input functions, real imaginary components of $V(\nu)$ are then computed from the stored data as:

$$V_R(\nu) = \sum_{i=1}^{N} |F_i(\nu)|\cos\phi_i(\nu) \quad (6)$$

$$V_I(\nu) = \sum_{i=1}^{N} |F_i(\nu)|\sin\phi_i(\nu)$$

where $V(\nu)=V_R(\nu)+jV_I(\nu)$. The power spectral density is found from the product VV*.

As described in more detail below, the hybrid system of the present invention can be modified to obtain the Fourier transform of a spatial signal that would normally extend beyond the input record aperture. In effect, this is achieved by improving the resolution of the spectrum analysis, or equivalently the space bandwidth product. If the spatially recorded signal is derived from a temporal source, then the time bandwidth product associated with the analysis is increased. The hybrid system synthesizes operation with an enlarged input aperture or equivalent integration time.

Figure 2:
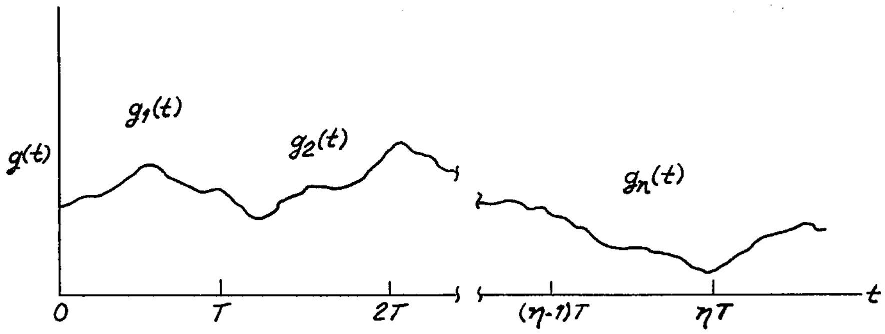
FIG. 2 is a representation of the function to be analyzed which is processed piecewise over T-Second time intervals.

The temporal function to be processed, g(t), is schematically portrayed in FIG. 2. Let T represent the time interval that corresponds to the input record aperture length L; it also denotes the integration time interval for the Fourier transformation. The function g(t) will be processed in a piecewise, sequential fashion over time intervals from t=0 to T, from T to 2T, etc. Let $f_n(x)$ be the recorded transmittance pattern corresponding to the g(t)- function in the time interval $(\eta-1)T \leqq t \leqq \eta T$. The x and t variables are related by:

$$x=v(t-(\eta-1)T) \text{ and } L=vT \quad (7)$$

The spacial Fourier transform of $f_n(x)$ is $$Fn(\nu) = \int_0^L f_n(x)\exp(-j2\pi\nu x)dx = \quad (8)$$

$$\exp(j2\pi(n-1)\nu L) \int_{(n-1)T}^{nT} g(t)\exp(-j2\pi v\nu t)dt$$

Thus, the temporal Fourier transform is $$\int_{(n-1)T}^{nT} g(t)\exp(-j2\pi ft)dt = \exp(-j2\pi(n-1)\nu L)F\eta(\nu) \quad (9)$$

where the temporal frequency $$f=v\nu \quad (10)$$

From Eq. (1), temporal frequency f and position in the $x_D$ plane are related by:

$$f=(v/\lambda F_T)X_D \quad (10a)$$

System parameters v,λ and $F_T$ are adjusted to satisfy this relation for given values of f and $x_D$.

Let G(f) be the Fourier transform of g(t) over the extended time interval, 0 to NT;

$$G(f) = \int_0^{NT} g(t)\exp(-j2\pi ft)dt = \quad (11)$$

$$\sum_{n=1}^{N} \int_{(n-1)T}^{nT} g(t)\exp(-j2\pi ft)dt$$

As a consequence of Eq. (9):

$$G(f) = \sum_{n=1}^{N} \exp(-j2\pi(n-1)\nu L)F_n(\nu) \quad (12)$$

The spatial Fourier transform in Eq. (12) is expressed in phasor form as:

$$F_n(\nu)=|F_n(\nu)|\exp(j\phi_n(\nu)) \quad (13)$$

With this, Eq. (12) becomes:

$$G(f) = \sum_{n=1}^{N} |F_n(\nu)|\exp(j\phi_n(\nu) - 2\pi(n-1)\nu L)) \quad (14)$$

Figure 3:
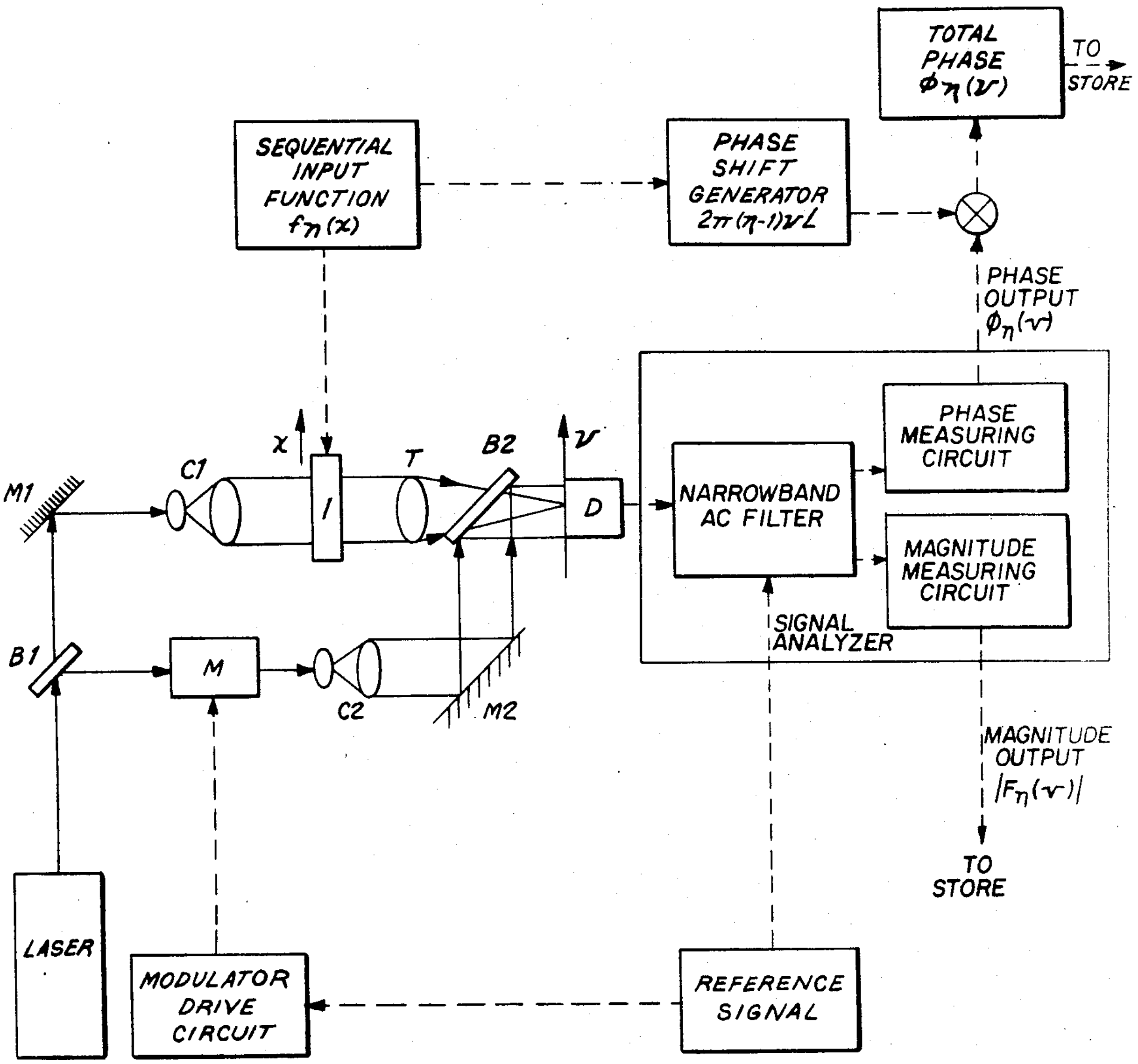
FIG. 3 is a representation of the hybrid system for sequential Fourier transform magnitude and phase determination of a piecewise processed signal.

Synthesis of the extended signal transform relation of Eq. (14) can be made with the system additions shown in FIG. 3. As shown therein, input signals $f_n(x)$ are sequentially processed via the optical transform section. When a particular record $f_n(x)$ is in view, its transform magnitude $|F_n(\nu)|$ and phase $\phi_n(\nu)$ are obtained as described above. The measured phase signal is then combined with an indexed phase shift term $2\pi(n-1)\nu L$ to form the final phase output. The phase shift term is incremented ($\Delta n=1$) for each additional function $f_n(x)$ processed in the input device. For a fixed optical signal aperture L, and at a given spatial frequency location $\nu$, the phase shift term depends only on the index number n. The magnitude $|F_n(\nu)|$ and total phase angle:

$$\Phi_n=\phi_n(\nu)-2\pi(n-1)\nu L \quad (15)$$

are measured and stored for each input step. After processing N functions, real and imaginary components of G(f) are then determined from:

$$G(f) = G_R(f) + jG_I(f) \quad (16)$$

$$G_R(f) = \sum_{n=1}^{N} |F_n(\nu)|\cos\Phi_n$$

$$G_I(f) = \sum_{n=1}^{N} |F_n(\nu)|\sin\Phi_n$$

Thus, with the inclusion of programmed additive phase shifts into the measurement system, one can achieve an N-fold increase in signal processing frequency resolution or time bandwidth product. The additive phase shift operation can be achieved by digital means. At a particular spatial frequency location in the detector plane the quantity $\nu$ (in Eq. (15)) is a constant. Since the length L is known, the additive phase term $2\pi(\eta-1)\nu L$ depends on n alone. For each input step n changes by one, so that the quantity added each time to the phase measurement is just $2\pi\nu L$, a constant for each frequency, $\nu$.

Figure 4:
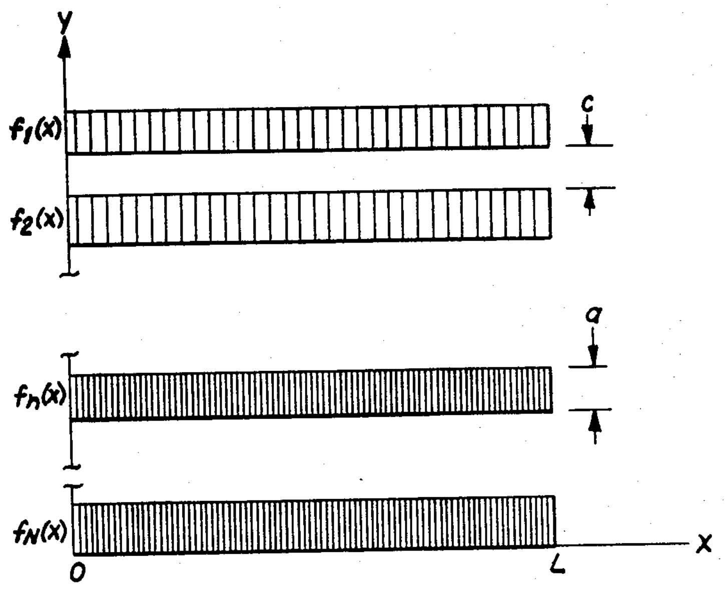
FIG. 4 is a representative raster geometry for two-dimensional recording.

A configuration for spatial data recording in two dimensions is the raster array geometry shown in FIG. 4. As shown therein, the temporal function g(t) is sequentially recorded as a raster transmittance pattern $f_n(x)$. Each scan is of length L, height a, and separation c. The transmittance is zero between individual scan lines. Let $y_n$ be the y-coordinate of the center of the n-th scan. Rectangular pulse functions are defined by:

$$H(x) = 1 \text{ for } 0 \leqq x \leqq L \quad (17a)$$
$$= 0 \text{ otherwise}$$

$$H(y - y_n) = 1 \text{ for } (y_n - a/2) \leqq y \leqq (y_n + a/2) \quad (17b)$$
$$= 0 \text{ otherwise}$$

$$y_n = y_1 - (n - 1)c \quad (17c)$$

The signal amplitude transmittance for the n-th step is:

$$s_n(x,y)=H(x)\,H(y-y_n)f_n(x) \quad (18)$$

The two-dimension light amplitude distribution in the Fourier plane expressed in terms of spatial frequency variables $\nu_x$ and $\nu_y$ is:

$$F_n(\nu_x, \nu_y) = \iint_{-\infty}^{\infty} S_n(x, y)\exp(-j2\pi(\nu_x x + \nu_y y))dxdy = \quad (19)$$

$$a\mathrm{Sinc}(\pi\nu_y a)\exp(-j2\pi\nu_y y_n) \int_0^L f_n(x)\exp(-j2\pi\nu_x x)dx$$

Let $$A=a\,\mathrm{Sinc}(\pi\nu_y\,a)\exp(-j2\pi\nu_y y_1) \quad (20a)$$

Then $$F_n(\nu_x,\nu_y)=A\,\exp(j2\pi(n-1)\nu_y c)F_n(\nu_x) \quad (20b)$$

Using Eq. (9), this two-dimensional transform distribution is related to the temporal transform by:

$$F_n(\nu_x, \nu_y) = A\exp(j2\pi(n - 1)\nu_y c)\exp(j2\pi(n - 1)\nu_x L) \int_{(n-1)T}^{nT} g(t)\exp(-j2\pi ft)dt \quad (21)$$

Figure 5:
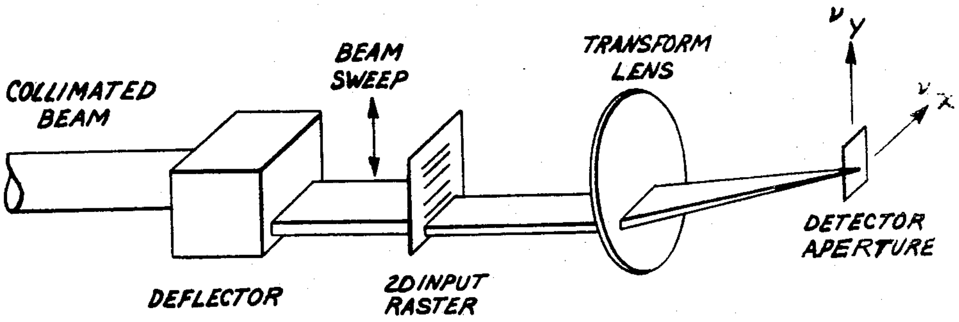
FIG. 5 is an illustration of sequential scanning of a two- dimensional raster array for piecewise processing of an extended signal.

Illumination of the two-dimensional raster array must be done sequentially. If the full pattern of N records were processed at once (as is done in prior two-dimensional integrating systems), then the output distribution, given by $\Sigma F_n(\nu_x,\nu_y)$, does not bear the correct relation to the desired transform G(f). However, by incorporating a deflector as shown in FIG. 5 in the hybrid configuration of FIG. 3 to sweep the collimated beam across the record I, i.e., the 2D input raster, individual data scans are processed one at a time; e.g., by sweeping a beam of narrow width in the y-direction as illustrated in FIG. 5. Assume for the moment that the detector array samples light only along the line $\nu_y=0$. Then the output signal at a given spatial frequency value $\nu_x$ is proportional to:

$$F_n(\nu_x, 0) = A\exp(j2\pi(n - 1)\nu_x L) \int_{(n-1)T}^{nT} g(t)\exp(-j2\pi ft)dt \quad (22)$$

Consequently, the Fourier transform of the time varying signal g(t) recorded in a two-dimensional raster format and processed in time sequence with a guided illumination beam is obtained from the sum:

$$G(f) = \sum_{n=1}^{N} \exp(-j2\pi(n - 1)\nu_x L)F_n(\nu_x, 0) \quad (23)$$

similar to the earlier result of Eq. (12).

When a full input frame of N-data lines has been processed, temporal signals can be rewritten over prior scan lines after erasure and then processing operations continued.

A processing gain of N in the time bandwidth product or equivalent frequency resolution is limited by the minimum detector element width in the $\nu_x$ direction. The time bandwidth product associated with a single input scan line is B=2WT, where W is the maximum signal frequency and T the signal integration time. Corresponding frequency resolution is $\Delta f=1/(2T)$. An N-fold increase in B requires that the detector element width be at least as small as the equivalent of 1/(2NT). If not, processing gain is degraded due to signal averaging in the $\nu_x$-direction.

Although several particular embodiments of the invention has been illustrated and described, modifications thereof will become apparent to those skilled in the art. For example, although not shown in either FIGS. 1 or 3, an additional transform distribution and superposed plane wave combination emerges from the beam splitter B2. A second detector array could be used here to overcome sampling omissions due to detector element spacing.

Accordingly, it is clear that the above descriptions of the preferred embodiment in no way limit the scope of the present invention which is defined by the following claims.

What is claimed is:

1. A method for making Fourier transform magnitude and phase measurements of an input signal recorded as a spatial transmittance pattern, which is encoded on a coherent light beam comprising the steps of:

(a) optically forming the Fourier transform spectrum of the recorded input signal;

(b) continuously phase modulating a portion of said coherent light beam to form a frequency shifted optical reference beam having a time varying phase;

(c) superposing said frequency shifted optical reference beam with said optical Fourier transform spectrum; and (d) electronically processing the intensity distribution of the combined frequency shifted optical reference beam and optical Fourier transform spectrum to obtain the magnitude and phase components of the Fourier transform of the input signal.

2. A method for making Fourier transform magnitude and phase measurements of an input signal, consisting of a sum of N input functions, each of which is recorded as a spatial transmittance pattern which is encoded on a coherent light beam in sequence comprising the steps of:

(a) optically forming in sequence the Fourier transform spectrum of each of the recorded input functions;

(b) continuously phase modulating a portion of said coherent light beam to form a frequency shifted optical reference beam having a time varying phase;

(c) superposing in sequence said frequency shifted optical reference beam with each of said optical Fourier transform spectra;

(d) electronically processing in sequence the intensity distribution of each of the combined frequency shifted optical reference beams and optical Fourier transform spectra to obtain the magnitude and phase components of the Fourier transform of each of the input functions;

(e) storing the magnitude and phase components of the Fourier transform of each of the input functions; and (f) computing from the stored data the magnitude and phase components of the Fourier transform of the input signal.

3. A method for obtaining the Fourier transform magnitude and phase measurements of an input signal recorded as a spatial transmittance pattern, which is encoded on a coherent light beam, said input signal extending beyond the input record aperture, comprising the steps of:

(a) decomposing the recorded input signal into a predetermined number of length segments;

(b) continuously phase modulating a portion of said coherent light beam to form a frequency shifted optical reference beam having a time varying phase;

(c) optically forming in sequence the Fourier transform spectrum of each of the decomposed length segments;

(d) superposing in sequence said frequency shifted optical reference beam with each of said optical Fourier transform spectra;

(e) electronically processing in sequence the intensity distribution of each of the combined frequency shifted optical reference beams and optical Fourier transform spectra to obtain the magnitude and phase components of the Fourier transform of each of the length segments;

(f) storing in sequence the magnitude and phase components of the Fourier transform of each of the length segments;

(g) computing from the stored data the magnitude component of the Fourier transform of the input signal; and (h) computing from the stored data the phase component of the Fourier transform of the input signal, said computation including the step of adding a preprogrammed, indexed phase shift term to each of the stored phase components.

4. A method for making Fourier transform magnitude and phase measurements of an input signal recorded as a spatial transmittance pattern in the form of a two-dimensional raster comprising the steps of:

(a) illuminating in vertical sequence narrow width portions of the input record with a beam of coherent light;

(b) gathering the diffracted rays with a transform lens;

(c) continuously phase modulating a portion of said beam of coherent light to form a frequency shifted reference beam having a time varying phase;

(d) superposing and adding interferometrically the transform light distribution to said frequency shifted reference beam; and (e) electronically processing the intensity distribution of the combined frequency shifted reference beam and optical Fourier transform spectrum to obtain from the time varying intensity component of the superposed beams the magnitude and phase components of the Fourier transform of the input signal.

5. Apparatus for making Fourier transform magnitude and phase measurements of an input signal recorded as a spatial transmittance pattern, which is encoded on a coherent light beam comprising:

(a) means for optically forming the Fourier transform spectrum of the recorded input signal;

(b) means for continuously phase modulating a portion of said coherent light beam to form a frequency shifted optical reference beam having a time varying phase;

(c) means for superposing said frequency shifted optical reference beam with said optical Fourier transform spectrum; and (d) means for electronically processing the intensity distribution of the combined frequency shifted optical reference beam and optical Fourier transform spectrum to obtain the magnitude and phase components of the Fourier transform of the input signal.

6. Apparatus for making Fourier transform magnitude and phase measurements of an input signal, consisting of a sum of N input functions, each of which is recorded as a spatial transmittance pattern which is encoded on a coherent light beam in sequence comprising:

(a) means for optically forming in sequence the Fourier transform spectrum of each of the recorded input functions;

(b) means for continuously phase modulating a portion of said coherent light beam to form a frequency shifted optical reference beam having a time varying phase;

(c) means for superposing in sequence said frequency shifted optical reference beam with each of said optical Fourier transform spectra;

(d) means for electronically processing in sequence the intensity distribution of each of the combined frequency shifted optical reference beams and optical Fourier transform spectra to obtain the magnitude and phase components of the Fourier transform of each of the input functions;

(e) means for storing the magnitude and phase components of the Fourier transform of each of the input functions; and (f) means for computing from the stored data the magnitude and phase components of the Fourier transform of the input signal.

7. Apparatus of obtaining the Fourier transform magnitude and phase measurements of an input signal recorded as a spatial transmittance pattern, which is encoded on a coherent light beam, said input signal extending beyond the input record aperture, comprising:

(a) means for decomposing the recorded input signal into a predetermined number of length segments;

(b) means for continuously phase modulating a portion of said coherent light beam to form a frequency shifted optical reference beam having a time varying phase;

(c) means for optically forming in sequence the Fourier transform spectrum of each of the decomposed length segments;

(d) means for superposing in sequence said frequency shifted optical reference beam with each of said optical Fourier transform spectra;

(e) means for electronically processing in sequence the intensity distribution of each of the combined frequency shifted optical reference beams and optical Fourier transform spectra to obtain the magnitude and phase components of the Fourier transform of each of the length segments;

(f) means for storing in sequence the magnitude and phase components of the Fourier transform of each of the length segments;

(g) means for computing from the stored data the magnitude component of the Fourier transform of the input signal; and (h) means for computing from the stored data the phase component of the Fourier transform of the input signal, said computation including the step of adding a preprogrammed, indexed phase shift term to each of the stored phase components.

8. Apparatus for making Fourier transform magnitude and phase measurements of an input signal recorded as a spatial transmittance pattern in the form of a two-dimensional raster comprising:

(a) means for illuminating in vertical sequence narrow width portions of the input record with a beam of coherent light;

(b) means for gathering the diffracted rays with a transform lens;

(c) means for continuously phase modulating a portion of said beam of coherent light to form a frequency shifted reference beam having a time varying phase;

(d) means for superposing and adding interferometrically the transform light distribution to said frequency shifted reference beam; and (e) means for electronically processing the intensity distribution of the combined frequency shifted reference beam and optical Fourier transform spectrum to obtain from the time varying intensity component of the superposed beams the magnitude and phase components of the Fourier transform of the input signal.

* * * * *

UNITED STATES PATENT AND TRADEMARK OFFICE

CERTIFICATE OF CORRECTION

PATENT NO. : 4,471,445

DATED : September 11, 1984

INVENTOR(S) : Benjamin J. Pernick

It is certified that error appears in the above-identified patent and that said Letters Patent is hereby corrected as shown below:

In column 2, line 59, "and" should read -- an --.

In column 5, line 32, "$F_2(x)$," should read -- $f_2(x)$, --; line 35, between "real" and "imaginary", insert -- and --.

In column 8, line 47, "$\Delta f=1/(2T)$" should read -- $\Delta f=1/2T$ --.

Signed and Sealed this

*Second* Day of *April 1985*

[SEAL]

*Attest:*

DONALD J. QUIGG

*Attesting Officer* *Acting Commissioner of Patents and Trademarks*